US 6,627,506 B2

(12) United States Patent
Kuhn et al.

(10) Patent No.: US 6,627,506 B2
(45) Date of Patent: *Sep. 30, 2003

(54) THIN TENSILE LAYERS IN SHALLOW TRENCH ISOLATION AND METHOD OF MAKING SAME

(75) Inventors: Kelin J. Kuhn, Aloha, OR (US); Ian R. Post, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/908,277

(22) Filed: Jul. 18, 2001

(65) Prior Publication Data

US 2002/0045325 A1 Apr. 18, 2002

Related U.S. Application Data

(63) Continuation of application No. 09/536,860, filed on Mar. 27, 2000, now Pat. No. 6,368,931.

(51) Int. Cl.[7] .............................................. H01L 21/331
(52) U.S. Cl. ........................ 438/359; 438/424; 438/781
(58) Field of Search .................................. 438/359, 435, 438/424, 443, 781, 787, 791, 761, 770, 775

(56) References Cited

U.S. PATENT DOCUMENTS

| | | | |
|---|---|---|---|
| 5,780,346 A | | 7/1998 | Arghavani et al. ......... 438/296 |
| 5,827,769 A | | 10/1998 | Aminzadeh et al. ........ 438/305 |
| 5,989,978 A | * | 11/1999 | Peidous ...................... 438/436 |
| 6,037,237 A | * | 3/2000 | Park et al. .................. 438/424 |
| 6,057,209 A | * | 5/2000 | Gardner et al. ............. 438/427 |
| 6,090,714 A | | 7/2000 | Jang et al. |
| 6,297,128 B1 | * | 10/2001 | Kim et al. ................... 438/437 |
| 6,328,794 B1 | * | 12/2001 | Brouillette et al. ........... 117/85 |
| 6,368,931 B1 | * | 4/2002 | Kuhn et al. ................. 438/359 |

OTHER PUBLICATIONS

Hamada, A., et al., "A New Aspect of Mechanical Stress Effects in Scaled MOS Devices", *IEEE Transactions on Electron Devices, 38*, 895–900, (Apr. 1991).

Hu, S., "Stress–Related Problems in Silicon Technology", *Journal of Applied Physics, 70*(6), R53–R80, (Sept. 15, 1991).

Kuroi, T., et al., "Stress Analysis of Shallow Trench Isolation for 256MDRAM and Beyond", *IEDM Techinal Digest*, 6.3.1–6.3.4, (Dec. 1998).

Law, M.E., et al., "Continuum Based Modeling of Silicon Integrated Circuit Processing: An Object Oriented Approach", *Computational Materials Science, 12*, 289–308, (1998).

Saino, K., et al., "Control of Trench Sidewall Stress in Bias ECR–CVD Oxide–Filled STI for Enhanced DRAM Data Retention Time", *IEDM Technical Digest*, 6.5.1–6.5.4, (Dec. 1998).

Scott, G., et al., "NMOS Drive Current Reduction Caused by Transistor Layout and Trench Isolation Induced Stress", *IEDM Technical Digest*, 34.4.1–34.4.4, (Dec. 1999).

(List continued on next page.)

*Primary Examiner*—Caridad Everhart
(74) *Attorney, Agent, or Firm*—Blakely, Sokoloff, Taylor & Zafman LLP

(57) ABSTRACT

The present invention relates to a method of forming an isolation trench that comprises forming a recess in a substrate and forming a film upon the sidewall under conditions that cause the film to have a tensile load. The method includes filling the recess with a material that imparts a compressive load upon the film under conditions that oppose the tensile load. The present invention is particularly well suited for shallow isolation trench filling in the 0.13 micron geometry range, and smaller.

15 Claims, 6 Drawing Sheets

OTHER PUBLICATIONS

Smeys, P., et al., "Influence of Process–Induced Stress on Device Characteristics and its Impact on Scaled Device Performance", *IEEE Transaction on Electron Device, 46*, 1245–1252, (Jun. 1999).

Steegen, A., et al., "Silicide Induced Pattern Density and Orientation Dependent Transconductance in MOS Transistors", *IEDM Technical Digest*, 20.1.1–20.1.4, (Dec. 1999).

Stiffler, S., "Oxidation–Induced Substrate Strain in Advanced Silicon Integrated–Circuit Fabrication", *Journal of Applied Physics, 68*, 351–355, (Jul. 1990).

Sze, S., "Piezoresistivity", *In: Semiconductor Sensors*, A Wiley–Interscience Publication, John Wiley & Sons, Inc., 160–177, (1994).

* cited by examiner ns. THIN TENSILE LAYERS IN SHALLOW
TRENCH ISOLATION AND METHOD OF
MAKING SAME This application is a continuation of U.S. Ser. No. 09/536,860, filed on March 27, 2000 now U.S. Pat. No. 6,368,931.

BACKGROUND OF THE INVENTION

1. Field of the Invention

The present invention relates generally to semiconductor fabrication, and, more specifically, the present invention relates to the fabrication of isolation structures. In particular, the present invention relates to the fabrication of shallow trench isolation structures.

2. Description of Related Art

In the fabrication of semiconductor isolation trench structures, processing is carried out to prevent problems that become more pronounced as miniaturization progresses. One such problem occurs in the 0.13 micron geometry processing regime, and at smaller geometries. At these geometries, a high-density plasma (HDP) physical vapor deposition (PVD) shallow trench fill process may be necessary to get a trench to properly fill. Unfortunately, the requisite HDP PVD conditions result in a compressive stress within the trench that is damaging to the semiconductive channel that it borders. The stress is presumed to cause an unacceptable decrease in the maximum drive current of the device. This decrease in the maximum drive current is presumed to be caused by lattice disruptions that result from the compressive stress. Under such conditions, an isolation trench filled with this compressive material exhibits destructive or damaging compression of the transistor channel. For example, an n-metal oxide silicon (NMOS) transistor experiences degradation of the NMOS transistor performance metrics such as mobility.

One proposed solution is to form the trench fill under conditions that make the material less compressive. However, this solution may create an unacceptable trade-off that results in an unfilled trench and possibly in losing favorable wet-etch, edge leakage, and polish performance of the more compressive HDP PVD shallow trench fill recipes.

Another problem is the formation of sharp top corners at the precipice of the trench in the silicon substrate. Sharp corners of the trench may carry stronger electromagnetic fields that may cause problems when later forming active regions on either side of the trench. For example. when forming a transistor adjacent to the trench a gate insulating oxide layer is grown over the substrate and over the trench, because of the sharp corners, the gate oxide layer cannot be grown with a uniform thickness because it becomes too thin over the sharp corners. The thin gate oxide layer may break down if subjected to high electromagnetic field.

Sharp top corners also cause a problem when filling the trench. As stated above, the trench is generally filled using HDP CVD techniques that fill the trench with materials such as an oxide, polysilicon, or a combination thereof. HDP CVD processes subject the structure to plasma that also induces an electric field around the sharp corners that causes a non-uniform deposition process and that may create gaps or voids in the trench fill.

What is needed is a method of shallow trench formation that overcomes the problems of the prior art.

BRIEF DESCRIPTION OF THE DRAWINGS

In order that the manner in which the above recited and other advantages of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

The present invention describes a shallow trench isolation (STI) structure and a method for making the STI structure that will resist destructive compression stresses that arise in the trench. The present invention allows for the high-density plasma (HDP) physical vapor deposition (PVD) compression fill oxides. Such HDP PVD oxides are usually necessary to get adequate filling into the trench and also they are best suited to subsequent wet etching and polishing of structures under new miniaturization geometries.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientations. The term "substrate" generally refers to the physical object that is the basic workpiece that is transformed by various process operations into the desired microelectronic configuration. A substrate may also be referred to as a wafer. Wafers may be made of semiconduting, non-semiconducting, or combinations of semiconducting and non-semiconducting materials.

Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

Figure 1A:
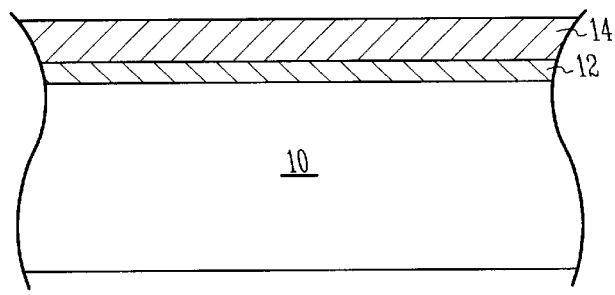
FIG. 1a illustrates a cross-sectional view of a semiconductor substrate with a pad oxide layer and a polish stop layer deposited thereon.

When forming a semiconductor device, an isolation trench may be formed in order to isolate one active region from another. FIGS. 1a–1k illustrate one embodiment of the present invention. FIG. 1a illustrates a semiconductor structure that includes a semiconductor substrate 10 with a pad oxide layer 12 and an etch stop layer 14 deposited thereon. Semiconductor substrate 10 may be made up of monocrystalline silicon. Etch stop layer 14 may be made up of a nitride, for example silicon nitride, $Si_3N_4$ as a stoichiometric silicon nitride example. Additionally, etch stop layer 14 may be a non-stoichiometric solid solution silicon nitride of silicon and nitrogen. In one embodiment of the present invention, etch stop layer 14 has a thickness in a range from about 100 nm to about 300 nm, preferably about 150 nm to about 160 nm. Pad oxide layer 12 has a thickness in a range from about 5 nm to about 20 nm, preferably about 10 nm.

Figure 1B:
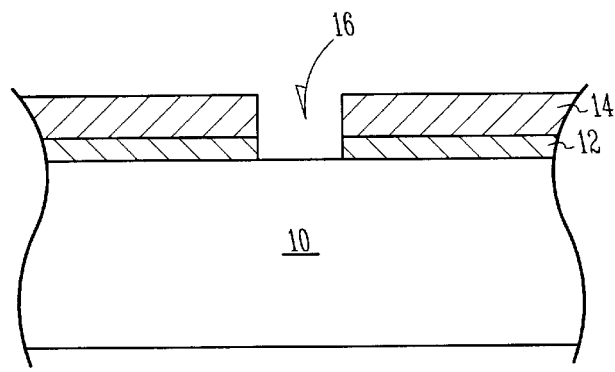
FIG. 1b illustrates a cross-sectional view of the structure in FIG. 1a after the pad oxide layer and polish stop layer have been patterned.
Figure 1C:
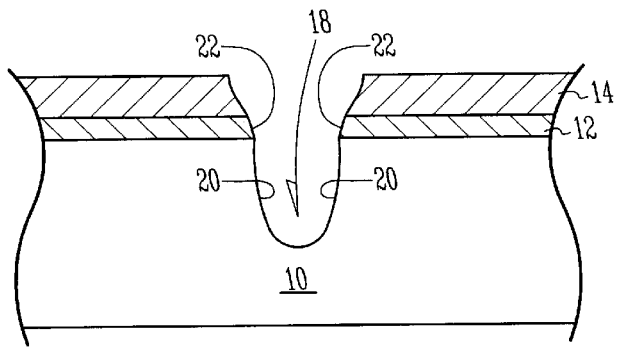
FIG. 1c illustrates a cross-sectional view of the structure in FIG. 1b after a recess has been etched in the semiconductor substrate.
Figure 1D:
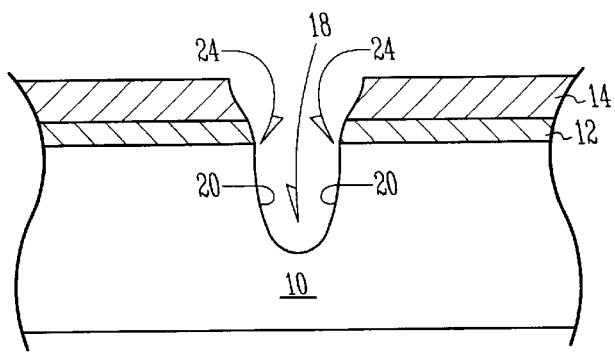
FIG. 1d illustrates a cross-sectional view of the structure in FIG. 1c after a preclean has been performed which rounds the top corners of the recess.

Etch stop layer 14 and pad oxide layer 12 are patterned and etched typically with a photoresist to form a pattern 16, as is illustrated in FIG. 1b. After etch stop layer 14 and pad oxide 12 are patterned, substrate 10 is etched to form a recess 18, as is illustrated in FIG. 1c. After recess 18 is etched, a preclean process to remove debris therefrom may treat the sidewalls 20. The recess preclean process may be performed by use of a chemistry made up of Standard Clean One (SC1), Standard Clean Two (SC2), and hydrofluoric acid. Standard Clean One is typically a combination of $NH_4OH$, $H_2O_2$, and $H_2O$, and Standard Clean Two is typically a combination of HCl, $H_2O_2$, and $H_2O$. The preclean process is performed for a duration long enough that the preclean chemistry will consume some of the silicon of semiconductor substrate 10. The consumption of the silicon during the preclean process may round the sharp top corners 22 of recess 18 to lessen or eliminate the sharp corner effect and to form round top corners 24, as illustrated in FIG. 1d. Additionally, the raw monocrystalline silicon of sidewall 20 may be passivated by treatment thereof with oxygen such as a purified $O_2$.

Figure 1E:
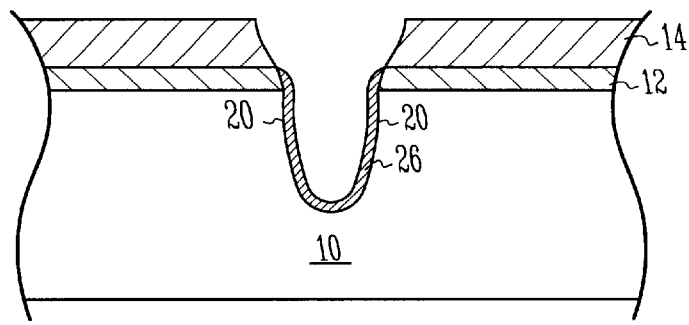
FIG. 1e illustrates a cross-sectional view of the structure in FIG. 1d during an $N_2O$ nitridation and anneal process.

In what may be called a pre-anneal process, a first nitride film 26 may be formed in recess 18 at least upon sidewall 20, as depicted in FIG. 1e. First nitride film 26 may be grown with $N_2O$ and/or $NH_3$ at a temperature in the range of about 900 C to about 1,100 C, preferably at 1,000 C Preferably, first nitride film 26 is grown with $N_2O$. Process time may be in a range from about 10–20 minutes, preferably about 15 minutes. Under these conditions, a thickness may be formed in the range from about 10 nm to about 40 nm, preferably about 25 nm. In one embodiment, first nitride film 26 is a thermal nitride that is grown at a temperature of about 1,000 C, and to a thickness of about 25 nm. Under proper concentrations of a nitrogen source, first nitride film 26 is grown for about 15 minutes.

In one embodiment, first nitride film 26 may be formed under conditions to allow for an adherence quality to sidewall 20 that resists the spalling thereof even under conditions wherein first nitride film 26 is under a tensile load. In one embodiment, first nitride film 26 may be under a tensile load in a range from about $2 \times 10^8$ $dyne/cm^2$ to about $9 \times 10^9$ $dyne/cm^2$ or higher.

Figure 1F:
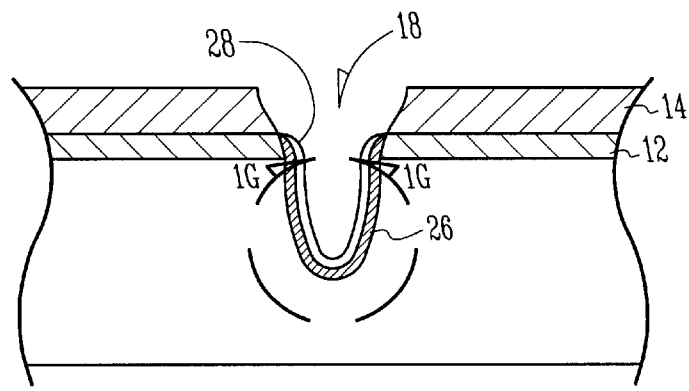
FIG. 1f illustrates a cross-sectional view of the structure in FIG. 1e after an oxynitride surface and a silicon-oxynitride interface have been formed.

After first nitride film 26 is formed, an oxide film 28 may be formed in recess 18 upon first nitride film 26. Oxide film 28 may be formed by a dry dichloroethane (DCE) assisted oxidation with thermal oxidation. The oxidation may be done under conditions from about 120 seconds to about 900 seconds, preferably from about 180 seconds to about 480 seconds, and most preferably about 250 seconds. Additionally the temperature range is from about 900 C to about 1,100 C Dry DCE may be flowed by bubbling nitrogen through liquid DCE. The result is an oxide film 28 as depicted in FIG. 1f that is formed upon first nitride film 26. Where it is preferable to make oxide film 28 thin, in the range from about 1 nm to about 20 nm, the presence of first nitride film 26 facilitates formation of a thin oxide film 28. Preferably, oxide film 28 is about 10 nm thick. In one embodiment of the present invention, oxide film 28 is formed upon sidewall 20, either directly upon substrate 10 or upon first nitride film 26, under a tensile load in a range from about $2 \times 10^8$ $dyne/cm^2$ to about $9 \times 10^9$ $dyne/cm^2$ or higher. Under these tensile conditions, oxide film 28 may be a stand-alone film or may be a composite with other films such as first nitride film 26.

Figure 1G:
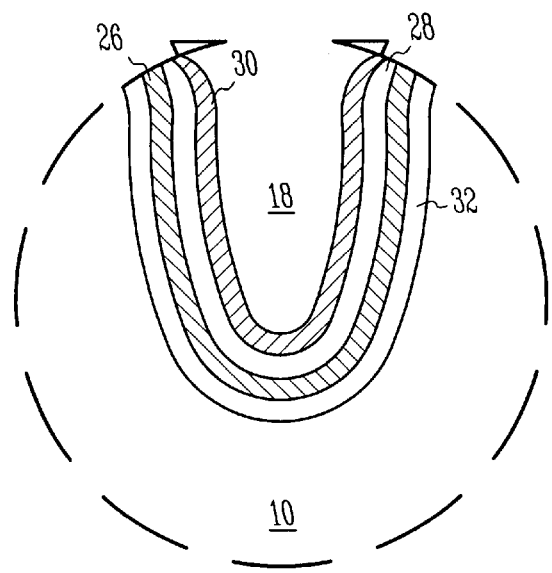
FIG. 1g illustrates a cross-sectional detail view of the structure in FIG. 1f after a thin tensile film has been formed upon the underlying layer(s)

FIG. 1g illustrates further processing of the semiconductor structure according to a close-up section taken from FIG. 1f, along the section line 1g—1g. In what may be called a post-anneal nitridation, a second nitride film 30 is formed within recess 18. Second nitride film 30 may form a nitrided oxide from oxide film 28. The nitrided oxide reacts with oxide film 28 to create an oxy-nitrided on the surface thereof. Under one embodiment, a silicon-oxynitride interface 32 forms between the silicon of semiconductor substrate 10 and oxide film 28 as illustrated in FIG. 1g. The structure depicted in FIG. 1g may be an intermediate structure that illustrates the formation of second nitride film 30 that may continue to grow until oxide film 28 is consumed. Additionally, silicon-oxynitride interface 32 may continue to grow until first a composition gradient boundary forms between silicon-oxynitride interface 32 and first nitride film 26, and second, the composition gradient is obscured by diffusion. Where it is preferable, the structure depicted in FIG. 1g may be a completed structure that is achieved by control of the conditions of the post-anneal nitridation.

By use of an $N_2O$ and/or $NH_3$ gas ambient, more of the surface of oxide film 28 may transform into second nitride film 30 than by using just a nitrogen plasma. These conditions may create a better and more substantial oxy-nitride surface in recess 18 to compensate for the trench compressive stress and also to create a barrier to prevent dopant outdiffusion from the active region into what will be come a filled trench. The use of a nitrided oxide allows the formation of adherent oxy-nitride and silicon-oxy-nitride films due to the chemical reaction between $N_2O$ and/or $NH_3$ and oxide film 28 and the silicon of substrate 10, respectively. As with the previous films that may accrue to sidewall 20, second nitride film 30 may be formed under a tensile load in a range from about $2 \times 10^8$ dyne/cm$^2$ to about $9 \times 10^9$ dyne/cm$^2$ or higher.

After the formation of second nitride film 30, the inventive process has various embodiments that may use second nitride film 30 or an underlying film 42 as a point of departure. As such, second nitride film 30 and/or other films that are adherent to sidewall 20 are referred to herein as an underlying film 42.

Figure 1H:
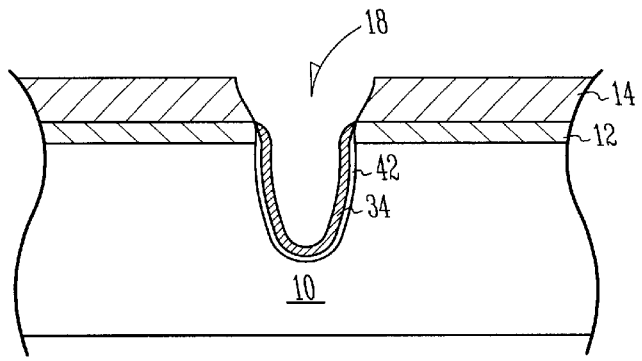
FIG. 1h illustrates a cross-sectional view of the structure in FIG. 1g.

In one embodiment, a deposited nitride film 34 may be formed upon underlying film 42 by such processes as chemical vapor deposition (CVD) or by physical vapor deposition (PVD). Preferably, deposited nitride film 34 is formed by depositing directly into recess 18 with any chemical reaction of underlying film 42 being incidental to the deposition. In other words, the preferred formation of deposited nitride film 34 may result in the solid solution, reaction, and/or mixture products with second nitride film 30. As with the previous films that may accrue to sidewall 20, deposited nitride film 34 may be formed under a tensile load in a range from about $2 \times 10^8$ dyne/cm$^2$ to about $9 \times 10^9$ dyne/cm$^2$ or higher. Forming of deposited nitride film 34 on underlying film 42 is preferably carried out by CVD of silicon nitride. Processing condition may be at a temperature range from about 30 C to about 60 C, at a power from about 300 Watts to about 400 Watts, and with a silicon nitride source selected from stoichiometric silicon nitride and solid solution silicon nitride. FIG. 1h illustrates a finished recess liner with deposited nitride film 34 disposed upon underlying film 42.

Figure 2:
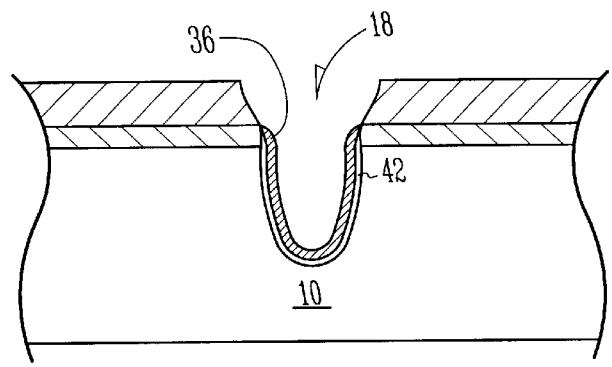
FIG. 2 is an elevational cross-sectional view of an alternative structure.

Another embodiment of the present invention is depicted in FIG. 2. After formation of second nitride film 30 or of an underlying film 42 as set forth above, a thermal nitride film 36 is grown onto underlying film 42. Thermal nitride film 36 is formed from a nitrogen source, preferably ammonia, NH$_3$, under RF conditions in a range from about 1,000 to about 5,000 Watts and at a temperature in a range from about 900 C to about 1,200 C, and for a process time in a range from about 30 seconds to about 90 seconds. According to these conditions, thermal nitride film 36 forms by thermal diffusion of the nitrogen source and has a thickness in a range from about 8 nm to about 60 nm, preferably from about 10 nm to about 50 nm. In this embodiment as in any of the embodiments set forth herein, the presence of any or all of first nitride film 26, oxide film 28, or second nitride film 30 may be preferred as referred to herein as underlying film 42. In any event, it is preferred that sidewall 20 be pacified before the formation of any film thereupon in order to reduce the frequency of dislocations that arise from bare silicon that may exist such as after a preclean process. As with the previous film(s) that may accrue to sidewall 20, thermal nitride film 36 may be formed under a tensile load in a range from about $2 \times 10^8$ dyne/cm$^2$ to about $9 \times 10^9$ dyne/cm$^2$ or higher.

Figure 3:
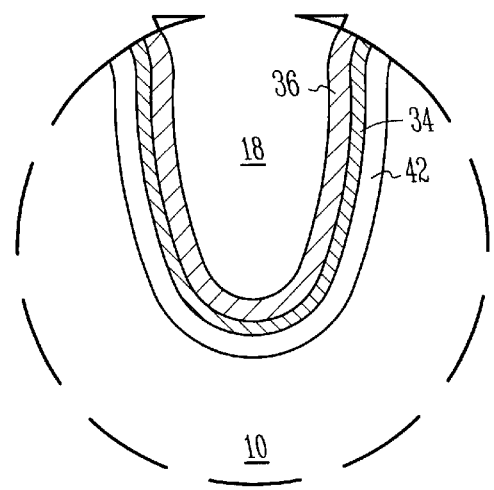
FIG. 3 illustrates a cross-sectional detail view of the structure in FIG. 2 after a film has been formed upon the underlying layer(s)

Another embodiment of the present invention relates to the formation first of deposited nitride film 34, followed by the formation of thermal nitride film 36 thereupon. FIG. 3 illustrates the finished recess lining with deposited nitride film 34, followed by thermal nitride film 36 formed upon underlying film 42. As with the previous films that may accrue to sidewall 20, at least one of deposited nitride film 34 or thermal nitride film 36 or all as a composite may be formed under a tensile load in a range from about $2 \times 10^8$ dyne/cm$^2$ to about $9 \times 10^9$ dyne/cm$^2$ or higher.

Figure 4:
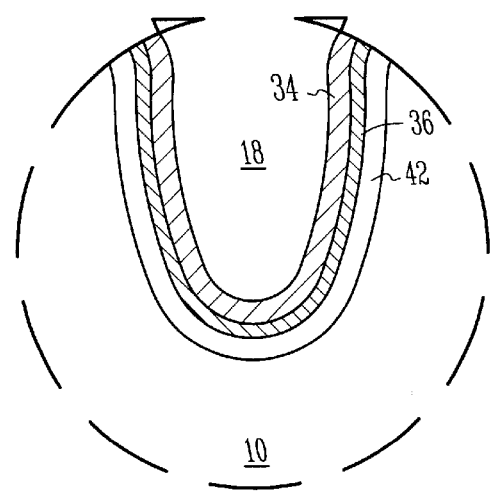
FIG. 4 is an elevational cross-sectional view of an alternative structure.

Another embodiment of the present invention relates to the formation first of thermal nitride film 36, followed by the formation of deposited nitride film 34 thereupon. In this embodiment, the presence of any or all of first nitride film 26, oxide film 28, or second nitride film 30 may be preferred. In any event, it is preferred that sidewall 20 be pacified before the formation of any film thereupon in order to reduce the frequency of dislocations that arise from bare silicon that may exist such as after a preclean process. FIG. 4 illustrates the finished recess lining with thermal nitride film 36, followed by deposited nitride film 34 upon underlying film 42. As with the previous films that may accrue to sidewall 20, at least one of deposited nitride film 34 or thermal nitride film 36 or all as a composite may be formed under a tensile load in a range from about $2 \times 10^8$ dyne/cm$^2$ to about $9 \times 10^9$ dyne/cm$^2$ or higher.

Figure 1I:
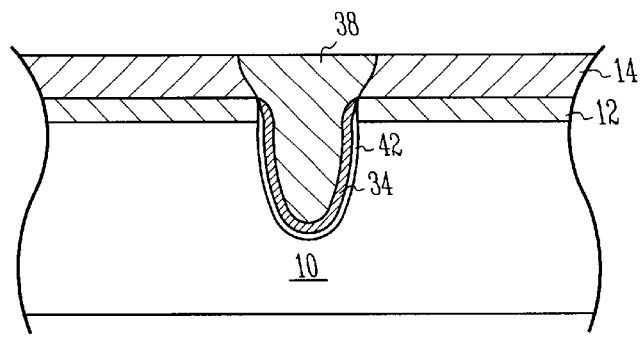
FIG. 1i illustrates a cross-sectional view of the structure in FIG. 1h after a trench fill process and a polish process have been performed.

FIG. 1i illustrates further processing of the structure depicted in FIG. 1h. After the configuration of a preferred film(s) that is under tension, recess 18 is filled in with a fill material structure that imparts a compressive load upon the film(s) under conditions that oppose the tensile load(s). Typically, the fill material 38 is an oxide structure that is HDP PVD launched into recess 18. In the 0.13 micron regime and lower, recess 18 is about 300 nm to about 600 nm deep, preferably about 500 nm deep or less. The formation of the structure that results from fill material 38 imparts a compressive load within recess 18 that counters the tensile load under which the tensile film(s) has been placed. In this manner, the tensile film(s) acts as a prestressed member that opposes the deleterious effects of fill material 38 structure imparting a compressive load that would otherwise significantly lower the maximum drive current possible for an NMOS device.

In one embodiment, the tensile film(s) is configured to counter the compressive effects of the trench fill process in a range from about 5% to about 150% and higher, preferably from about 10% to about 120%. Where the compressive effects of the trench fill process are on the less compressive side, the tensile film(s) is configured to counter the compressive effects in a range from about 10% to about 99%, and preferably from about 50% to about 90%. Where the compressive effects of the trench fill process are on the more compressive side, the tensile film(s) is configured to counter the compressive effects in a range from about 100% to about 150%, and preferably from about 100% to about 110%.

Preferably, a trench fill oxide 38 is the fill material that forms a structure. For one embodiment of the present invention, the thickness of trench fill oxide 3 8 may depend on the dimensions of the recess to be filled. In addition, the thickness of trench fill oxide 38 should be chosen to provide adequate planarization and process control during the planarization etch back process.

An important aspect to consider when selecting the material used to fill recess 18 except for one surprising embodiment, set forth below, is that the inner tensile film material selected should be chemically different from the underlying material that is used to mask the surface of the semiconductor substrate. For example, in one embodiment of the present invention in which a nitride layer is used as etch- or polish-stop layer 14, the material used as deposited nitride film 34 is preferably not a chemically equivalent nitride. In this manner, processes and chemistries may be implemented during subsequent planarization etch back to ensure that the etch-back of the structure that forms trench fill oxide 38 does not cause trench fill oxide 38 to lift out of recess 18 due to otherwise simultaneous dissolution of the tensile film 34.

Figure 1J:
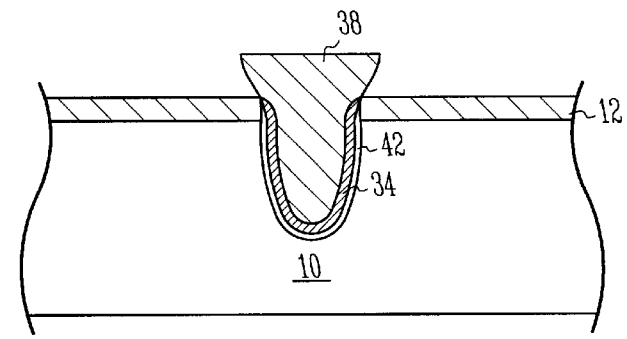
FIG. 1j illustrates a cross-sectional view of the structure in FIG. 1i after the polish stop layer has been removed.
Figure 1K:
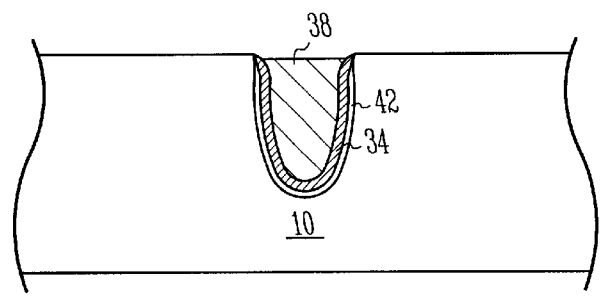
FIG. 1k illustrates a cross-sectional view of the structure in FIG. 1j after an etch-back process is performed.

After recess 18 is filled with a structure, trench fill oxide 38 is then polished or otherwise planarized in order to remove the excess oxide above etch stop layer 14, as is illustrated in FIG. 1i. As illustrated in FIG. 1j, etch stop layer 14 is then removed. It should be noted that etch stop layer 14 may be removed using conventional etch techniques. After etch stop layer 14 is removed, an etch-back process is performed in order to isolate films disposed in recess 18 along with the structure such as trench fill oxide 38 also disposed within recess 18, as is illustrated in FIG. 1k. It should be noted that this etch-back process may be performed using chemical mechanical polishing (CMP) techniques.

The following is a comparison of various embodiments of the present invention. A previously lowered drive current that was caused by HDP PVD filling of a recess, experienced a restoration range after the formation of an inner film in the recess. For example, NMOS mobility, measured in $cm^2$/Volt seconds, that experienced a mobility lowering of about 5% to about 20%, particularly on devices of narrow width, experienced a mobility restoration in a range from about 20% to about 120% of the original NMOS mobility. The inner film, whether deposited nitride film 34, thermal nitride film 36, or another was formed in a thickness range from about 0.5 nm to about 50 nm. It was observed that the highest NMOS mobility restoration percentages occurred with inner tensile film thicknesses in a range from about 0.5 nm to about 3 nm, preferably from about 1 nm to about 2 nm. In one embodiment, where the innermost film such as deposited nitride film 34 or thermal nitride film 36, or both either singly or as a composite, was in a range from about 1 nm to about 2 nm, restoration of the original NMOS mobility was in a range from about 96% to about 118%.

Figure 5:
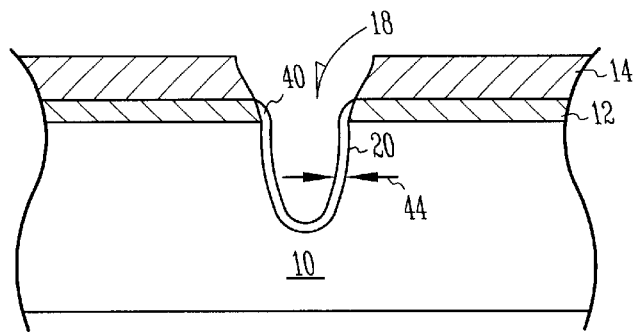
FIG. 5 illustrates a cross-sectional view of an alternative structure.

In one embodiment of the present invention, a tensile film 40 is disposed within recess 18 as illustrated in FIG. 5 and trench fill is carried out as set for the above (not pictured) to form a fill structure. In contravention to what was previously assumed to be preferred, the material of inner tensile film 40 is chemically equivalent to etch stop layer 14. It was discovered that where tensile film 40 is a nitride material according to embodiments disclosed herein, so long as the thickness of tensile film 40 is about 50 nm or less as disposed upon flat horizontal surfaces (and consequently about 25 nm thickness 44 or less as disposed at sidewall 20), a hot phosphoric acid wet etch that removes etch stop layer 14, effectively does not remove tensile film 40. In other words, although etch stop layer 14 and tensile film 40 that is disposed within recess 18 may have equivalent chemical compositions, including substantially identical chemical recipes, the hot phosphoric wet etch is selective to a film that is disposed between the substrate 10 and the structure of trench fill oxide 38, so long as the in-recess thickness 44 of tensile film 40 is about 25 nm or less. In one embodiment of the present invention, tensile film 40 has a thickness 44 upon sidewall 20 within recess 18 equal to or below about 25 nm. Preferably, tensile film 40 has a thickness 44 upon sidewall 20 within recess equal to or below about 20 nm.

Figure 6:
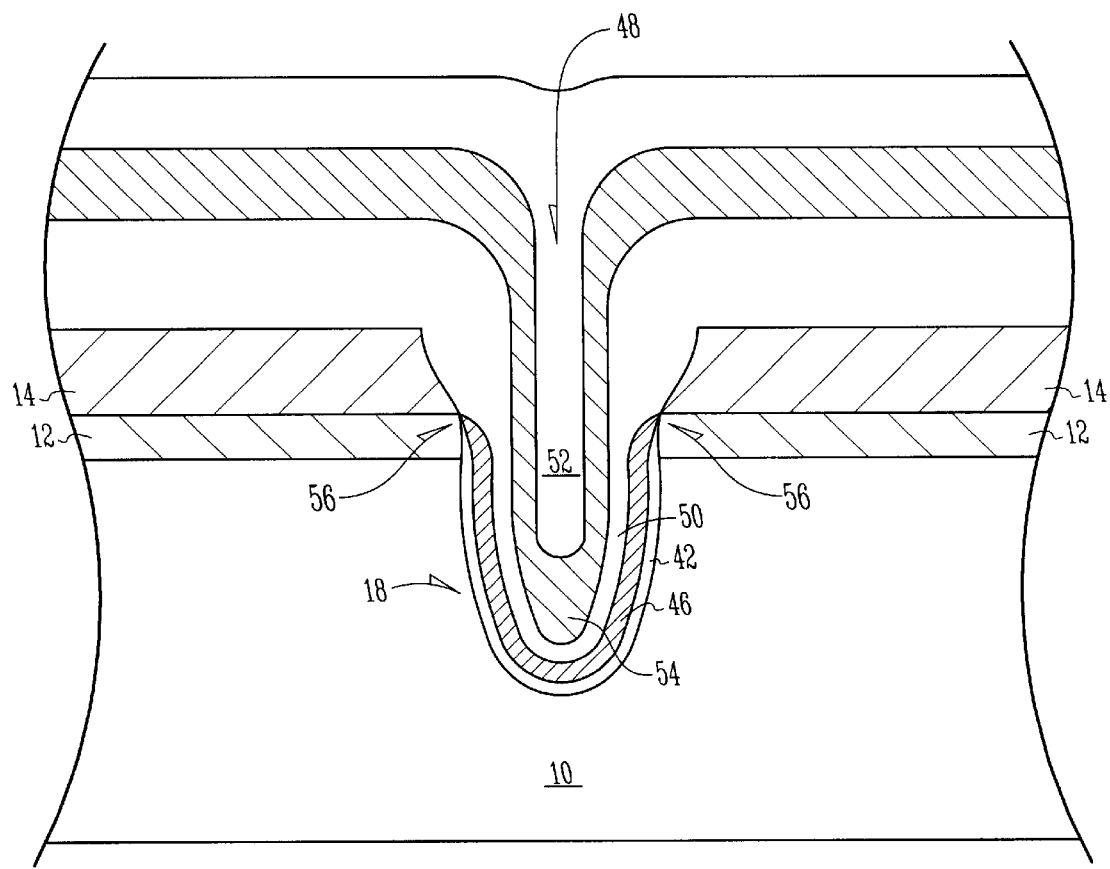
FIG. 6 illustrates a multi-layer stack trench fill structure embodiment.

Note that for other embodiments of the present invention, the single fill material that is used to fill recess 18 may be replaced by a multi-layer stack structure of trench fill materials suitable for the particular application in which they are employed. In other words a multi-layer stack structure of trench fill materials may be configured with each layer being formed with differing or similar compressive stresses inside recess 18. For example, as illustrated in FIG. 6 underlying film 42 and an inner tensile film 46 such as any set forth herein, is surmounted by a multi-layer stack 48 structure of trench fill materials formed within recess 18. At least two layers comprising a first layer 50 and a second layer 52 are disposed therewithin. At least one optional intermediate layer 54 may be interposed between first layer 50 and second layer 52. Typically, the higher compressive stress layer is denser than the lower compressive stress layer.

In a first embodiment, each of first layer 50, second layer 52, and intermediate layer 54 if present, has substantially the same compressive stress. In another embodiment, a multi-layer stack 48 of trench fill materials is deposited to form a structure in recess 18, wherein a compressive stress for at least one layer is formed in a compressive range from about $1 \times 10^9$ to about $4 \times 10^9$ dyne/$cm^2$.

Depending upon the particular application, it may be desirable to form multi-layer stack 48 of trench fill material wherein the greater compressive stress within multi-layer stack 48 is manipulated to originate at or near the tensile film(s) 46. In this embodiment, first layer 50 has a higher compressive stress than second layer 52. One advantage of this embodiment is that after polishing and wet cleans, the corner 56 of pad oxide layer 12 is prevented from rounding because the presence of a higher compressive stress first layer 50 acts as protection thereto.

In another embodiment, it may be desirable to form multi-layer stack 48 of trench fill material, wherein the higher compressive stress originates at or near the center of recess 18 such as in second layer 52. In this embodiment, a plurality of trench fill layers 50, optionally 54, and 52, is formed in series within recess 18 to make a trench fill structure. First layer 50 is formed under a first compressive stress, and second layer 52 is formed under a second compressive stress. In this embodiment, the first compressive stress is less than the second compressive stress.

In either embodiment as set forth above, it preferable that intermediate layer(s) 54, if present, has a compressive stress that is greater than one of first 1ayer 50 and second layer 52, and less than one of first layer and second layer 52.

Figure 7:
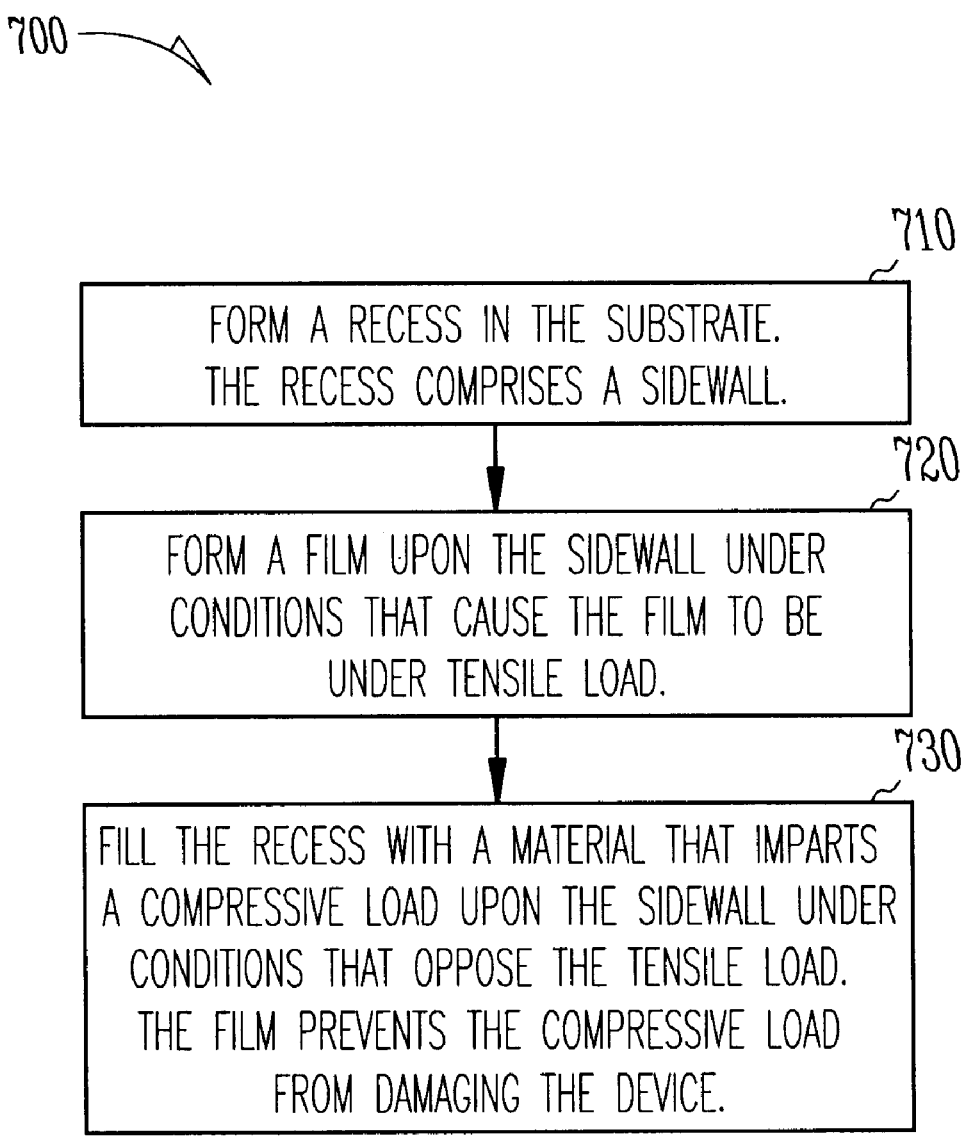
FIG. 7 is a process flow diagram of the inventive method.

FIG. 7 illustrates the inventive process 700 in overview. First, process flow block 710 illustrates the formation of a recess in a substrate. The preferred embodiment for the substrate is a semiconductor substrate and the recess is an STI. The recess includes a sidewall. Process flow block 720 illustrates the formation of a film upon the sidewall or upon an underlying layer that is disposed upon the sidewall. The film has a tensile load that is useful for later processing. Process flow block 730 illustrates the filling of the recess with a material that imparts a compressive load upon the sidewall. In the preferred embodiment, at least one HDP PVD is used to fill the recess due to its miniaturized dimensions. The compressive load and the tensile load oppose each other. Tension in the film prevents the compressive load from adversely affecting performance of the device that the substrate is a part of. In the preferred embodiment, the device is an STI and performance is NMOS mobility in a semiconductive channel that is contiguous to the inventive STI structure.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A method of forming an isolation trench comprising:
   forming a recess in a substrate, wherein the recess comprises a sidewall;
   forming a film upon the sidewall under conditions that cause the film to be under a tensile load; and filling the recess with a material that imparts a compressive load upon the sidewall under conditions that oppose the tensile load, wherein filling the recess is carried out by a high-density plasma physical vapor deposition process.

2. The method according to claim 1, wherein the film has a tensile load in range from about $2 \times 10^8$ dyne/cm$^2$ to about $9 \times 10^9$ dyne/cm$^2$.

3. The method according to claim 1, wherein filling the recess opposes the tensile load in a range from about 10% to about 120%.

4. The method according to claim 1, wherein filling the recess opposes the tensile load in a range from about 50% to about 99%.

5. The method according to claim 1, wherein filling the recess opposes the tensile load in a range from about 100% to about 110%.

6. A method of forming an isolation trench comprising:

forming a recess in a substrate, wherein the recess comprises a sidewall;

forming a film upon the sidewall under conditions that cause the film to be under a tensile load; and filling the recess with a material that imparts a compressive load upon the sidewall under conditions that oppose the tensile load wherein filling the recess includes:

forming a fill material structure in the recess, wherein the fill material structure comprises a first layer and a second layer, wherein the first layer has a first compressive stress and the second layer has a second compressive stress.

7. The method according to claim 6, wherein forming a film upon the sidewall comprises:

an oxide film.

8. A method of forming an isolation trench comprising:

forming a recess in a substrate, wherein the recess comprises a sidewall;

forming a film upon the sidewall under conditions that cause the film to be under a tensile load; and filling the recess with a material that imparts a compressive load upon the sidewall under conditions that oppose the tensile load, wherein forming a film upon the sidewall includes:

forming an underlying film on the sidewall; and forming a thermal nitride film on the underlying film, wherein the thermal nitride film is formed by thermal growth from a nitrogen source.

9. The method according to claim 8, wherein forming a film upon the sidewall comprises:

forming an underlying film on the sidewall; and forming a thermal nitride film on the underlying film, wherein the thermal nitride film is formed by thermal diffusion of a nitrogen-containing composition at a temperature range from about 90° C. to about 1,200° C., for a time in a range from about 30 seconds to about 90 seconds.

10. The method according to claim 8, wherein filling the recess comprises:

performing a series of depositions to form a multi-layer structure in the recess.

11. A method of forming an isolation trench comprising:

forming a recess in a substrate, wherein the recess comprises a sidewall;

forming a film upon the sidewall under conditions that cause the film to be under a tensile load; and filling the recess with a material that imparts a compressive load upon the sidewall under conditions that oppose the tensile load, wherein forming a film upon the sidewall includes:

performing a recess preclean;

forming a first nitride film on the sidewall; and isolating the nitride film within the recess by performing a chemical mechanical polishing etch-back.

12. The method according to claim 11, wherein forming a film upon the sidewall comprises:

forming an oxide film in the recess, wherein the oxide film is formed by a method including growing a thermal oxide within the recess.

13. The method according to claim 11, wherein forming a film upon the sidewall compromises:

forming an underlying film on the sidewall; and forming an inner film upon the underlying film, wherein the inner film comprises a thickness in a range from about 5 nm to about 50 nm.

14. A shallow trench isolation structure comprising:

a recess in a substrate, wherein the recess has a sidewall;

an underlying film disposed upon the sidewall;

a nitride film disposed upon the underlying film wherein the nitride film is under a tensile load; and a fill material structure that fills the recess, wherein the fill material structure imparts a compressive load that counters the tensile load, and wherein the fill material structure comprises a first layer and a second layer, wherein the first layer has a first compressive stress and the second layer has a second compressive stress.

15. The shallow trench isolation structure according to claim 14, wherein the nitride film has a sidewall that is less than or equal to about 20 nm.

* * * * *

UNITED STATES PATENT AND TRADEMARK OFFICE
CERTIFICATE OF CORRECTION

PATENT NO. : 6,627,506 B2
DATED : September 30, 2003
INVENTOR(S) : Kuhn et al.

It is certified that error appears in the above-identified patent and that said Letters Patent is hereby corrected as shown below:

<u>Column 4,</u>
Line 42, delete "oxy-nitrided", insert -- oxy-nitride --.

Signed and Sealed this

Thirteenth Day of January, 2004

JON W. DUDAS
*Acting Director of the United States Patent and Trademark Office*